(12) United States Patent  (10) Patent No.: US 6,803,283 B1
Chen  (45) Date of Patent: Oct. 12, 2004

(54) METHOD TO CODE FLASHROM USING LDD AND SOURCE/DRAIN IMPLANT

(75) Inventor: Jiun-Nan Chen, Taipei (TW)

(73) Assignee: Taiwan Semiconductor Manufacturing Co. Ltd., Hsin-Chu (TW)

( * ) Notice: Subject to any disclaimer, the term of this patent is extended or adjusted under 35 U.S.C. 154(b) by 0 days.

(21) Appl. No.: 10/261,345

(22) Filed: Sep. 30, 2002

(51) Int. Cl.⁷ .................. H01L 21/8234; H01L 21/336
(52) U.S. Cl. ...................................... 438/275; 438/257
(58) Field of Search ......................... 438/211, 257–267, 438/230–232, 304–306, 130, 275

(56) References Cited

U.S. PATENT DOCUMENTS

| | | | | |
|---|---|---|---|---|
| 4,380,866 A | * | 4/1983 | Countryman et al. | 438/130 |
| 4,406,049 A | * | 9/1983 | Tam et al. | 438/130 |
| 4,536,944 A | * | 8/1985 | Bracco et al. | 438/130 |
| 4,683,641 A | * | 8/1987 | Ravindhran et al. | 438/130 |
| 5,514,610 A | | 5/1996 | Wann et al. | 437/45 |
| 5,631,180 A | * | 5/1997 | Gyure et al. | 438/275 |
| 5,644,154 A | * | 7/1997 | Spinella et al. | 257/390 |
| 5,786,616 A | | 7/1998 | Fukumoto et al. | 257/358 |
| 6,020,241 A | | 2/2000 | You et al. | 438/278 |
| 6,238,983 B1 | | 5/2001 | Chu et al. | 438/275 |

* cited by examiner

*Primary Examiner*—Eric Kielin

(57) ABSTRACT

A new method to form ROM devices in the manufacture of an integrated circuit device is achieved. The method comprises providing a semiconductor substrate. MOS gates are formed overlying the substrate. Ions are implanted into the substrate to form lightly doped drains for the MOS gates. A masking layer is used to offset the lightly doped drains from selective MOS gates to thereby form constant-OFF MOS gates. Spacers are next formed on the sidewalls of the MOS gates. Finally, ions are implanted into the substrate to form source and drain regions for the MOS gates to thereby complete the ROM devices in the manufacture of said integrated circuit device. The method may be extended to form ROM devices from Flash gates in a FlashROM process.

10 Claims, 4 Drawing Sheets

US 6,803,283 B1

METHOD TO CODE FLASHROM USING LDD AND SOURCE/DRAIN IMPLANT

BACKGROUND OF THE INVENTION (1) Field of the Invention

The invention relates to a method to form ROM devices and, more particularly, to a method to form ROM devices wherein the coding of each ROM cell is controlled by the LDD and source/drain, ion implantation steps.

(2) Description of the Prior Art

Data storage devices are used in a variety of integrated circuits applications. A particularly important type of data storage device is the read-only memory (ROM). In a ROM device, data is permanently coded into the memory array for later read-out. By comparison, in a RAM device, the data may be altered during subsequent operation of the memory. ROM memory is typically used for the storage of computer programs and other information that will never require altering during the operating life of the application system. Where the system requires alterable memory, RAM memory or Flash memory may be included to provide changeable memory arrays that are either lost or retained, respectively, upon power down.

Typically, the ROM data is programmed into the device during the integrated circuit manufacturing process. Because of the relatively long cycle time required for integrated circuit fabrication, the system designer must provide the circuit fabricator with the final program data well in advance of the completion of manufacture. This fact tends to reduce the available system design time. At the same time, the manufacture attempts to fabricate the device in such a way as to delay the required program coding as long as possible to thereby maximize the system design time.

Referring now to FIG. 1, an exemplary, prior art ROM integrated circuit device is shown. More particularly, a simplified cross-section of a ROM device is shown at an intermediate step in the fabrication process for a ROM array. The ROM array comprises a large number of ROM devices formed in a substrate 10. In the cross-section, two partially complete devices are shown. A first device 50 and a second device 60 are being formed in active areas of the substrate 10. The active areas of the substrate 10 are separated by field oxidation regions (FOX) 20. Two MOS gates 25, comprising polysilicon 34 overlying oxide 30, have been formed in the active areas for the first device 50 and for the second device 60.

Referring now to FIG. 2, a further step in processing in shown. Assuming a sub-micron process where short channel effects must be considered, an ion implantation 64 is performed to form lightly doped drains (LDD) 68 in the substrate. Note that this implantation is blocked from unwanted areas in the circuit device by a masking layer 66. However, in the array devices 50 and 60, the LDD ion implantation 64 is a blanket implant. The MOS gates 25 block ions from the channel region of the devices such that the LDD regions 68 are self-aligned to the gates 25.

Referring now to FIG. 3, yet further steps in conventional processing are shown. After spacers 76 are formed on the sidewalls of the gates 25, another ion implantation is performed 84. This ion implantation 84 forms source and drain regions 88 in the substrate for the ROM devices 50 and 60. The implantation 84 is again blocked from unwanted areas by a masking layer 80. The combination of the MOS gates 25 and the spacers 76 cause the source/drain regions 88 to be self-aligned to the spacers 76.

The resulting devices 50 and 60 are recognizable as MOS transistors. A typical data storage mechanism for such a MOS-based, ROM array is the threshold voltage of the devices. The threshold voltage is defined as the gate-to-source voltage at which a conductive channel is formed, by inversion, such that the device is in the ON-state. This threshold voltage is coded into each device in the array by a subsequent manufacturing process as will be discussed below. In the ROM, additional circuitry is used to select particular transistors in the array and to read the value of the data stored thereon by monitoring current flow in the device in response to a standard gate-to-source voltage.

Referring now to FIG. 4, a typical method for storing the threshold voltage in each cell in the array is shown. A ROM code, ion implantation 104 is performed on the array. Ions are implanted 104 into the substrate 10 through selected gates 25 in the array. A masking layer 100 is used to control which ROM cells 50 receive the implant 104 and which ROM cells 60 do not receive the implant 104. Where the masking layer 100 is open, ions penetrate the gate 25 and form a doped region 110 in the substrate 10. Where the masking layer 100 covers a gate 25, ions cannot penetrate, and no doped region is formed 120.

For example, if the ROM array comprises NMOS devices, then the substrate 10 will be lightly-doped P-type, the LDD regions 68 will be doped n-type, and the source/drain regions 88 will be heavily doped n-type. In this exemplary case, the coding implant 104 increases the p-doping 110 in the channel region of the implanted transistor 50. This will effectively increase the threshold voltage of the device 50. If the implant dose is made sufficiently high, the p-coded region 110 will cause the threshold voltage of the coded device 50 tobe too high to be turned ON by the available gate-to-source voltage of the operating ROM device. In this case, the coded ROM cell 50 is programmed 'OFF' or constant-OFF. By comparison, the non-coded device 60 has a low threshold voltage and can be turned-ON by the standard gate-to-source voltage of the operating ROM device. In this way, a part of the available ROM devices is programmed to '0' while another part of the device array is programmed to '1'.

While the above-described method for forming and coding the ROM will work, there are several drawbacks. First, to form a ROM array out of a MOS device array, the method requires an additional photolithographic layer and an ion implantation step for p-coding. Second, if the MOS gate 25 is too thick, it is not possible to implant the p-code after the gate is formed. If the p-code must be implanted earlier in the process, this increases the cycle time or, conversely, reduces the available system design time.

Recently, manufacturers have developed methods to convert Flash memory device arrays into ROM arrays. This is a particularly useful technique for allowing the system designer to develop a first generation system using the alterable Flash array and then to convert the Flash array to a ROM array when the system program has been finalized. These Flash-ROM or FlashROM devices are Flash arrays in which relatively simple layout changes in the mask set will rapidly transform the Flash array product into a ROM array product while providing the same pin-out and access performance. In this FlashROM scenario, the MOS gate 25 is originally a Flash gate, comprising a stacked floating gate and control gate. However, the Flash gate is changed in to a simple MOS gate 25 during the Flash-to-ROM conversion process by modifying several masking layers. The p-coding layer is then added to the masking set for programming the ROM devices. A significant object of the present invention is to reduce the cost and timing impact of the formation of such ROM arrays, especially in the FlashROM case.

Several prior art inventions relate to methods to form and to code ROM devices. U.S. Pat. No. 6,020,241 to You et al discloses a mask ROM process. This method allows a ROM to be manufactured up to the metal processes prior to committing to a program code. The method uses a selective ion implantation through preformed openings to code the ROM array. U.S. Pat. No. 6,238,983 to Chu et al describes a method to code ROM cells. Selected ROM cells are dipped back to remove part of a poly-oxide layer overlying the gate. The ROM cells are then ion implanted through the gate to code enhancement or depletion mode. U.S. Pat. No. 5,514,610 to Wann et al teaches a method to code ROM cells. Ions are implanted into through ROM gates after a screen oxide is selectively removed.

SUMMARY OF THE INVENTION

A principal object of the present invention is to provide an effective and very manufacturable method to form and to code ROM devices.

A further object of the present invention is to form and code ROM devices without adding a p-code, ion implantation step.

A yet further object of the present invention is to form and code ROM devices using existing layers and changing as few layers as possible.

Another further object of the present invention is to form and to code ROM devices from a Flash device layout.

Another yet further object of the present invention is to form and to code FlashROM devices without adding an ion implantation step and by changing as few mask levels as possible.

In accordance with the objects of this invention, a method to form ROM devices in the manufacture of an integrated circuit device is achieved. The method comprises providing a semiconductor substrate. MOS gates are formed overlying the substrate. Ions are implanted into the substrate to form lightly doped drains for the MOS gates. A masking layer is used to offset the lightly doped drains from selective MOS gates to thereby form constant-OFF MOS gates. Spacers are next formed on the sidewalls of the MOS gates. Finally, ions are implanted into the substrate to form source and drain regions for the MOS gates to thereby complete the ROM devices in the manufacture of said integrated circuit device. The method may be extended to form ROM devices from Flash gates.

Also in accordance with the objects of the present invention, a ROM integrated circuit device is achieved. The device comprises a semiconductor substrate. MOS gates overlie the substrate. Lightly doped drains are in the substrate for the MOS gates. The lightly doped drains are offset from selective MOS gates to thereby form constant-OFF MOS gates. Spacers are on sidewalls of the MOS gates. Source and drain regions for the MOS gates. The sources and drains are offset from the constant-OFF MOS gates.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method to form and to code ROM devices. The method uses the available LDD and source/drain layers to code the ROM devices. The method does not require an additional p-code implant. The method is ideally suited for converting Flash devices into ROM devices in a FlashROM array. It should be clear to those experienced in the art that the present invention can be applied and extended without deviating from the scope of the present invention.

Figure 1:
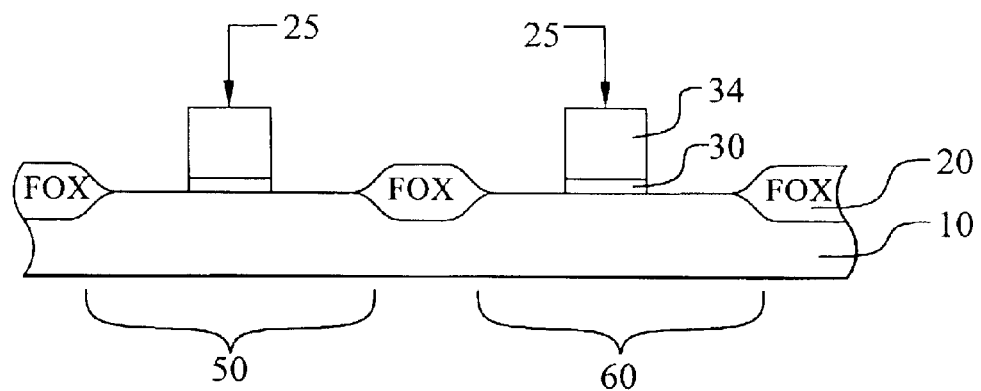
FIGS. 1 through 4 illustrate a prior art method to form and to code ROM devices.
Figure 2:
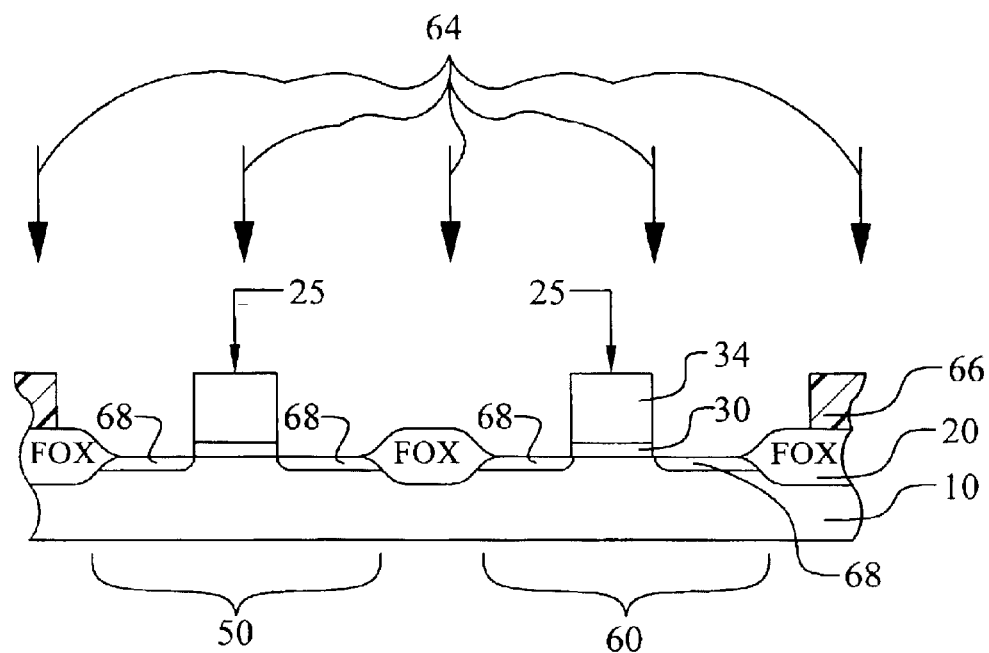
Figure 3:
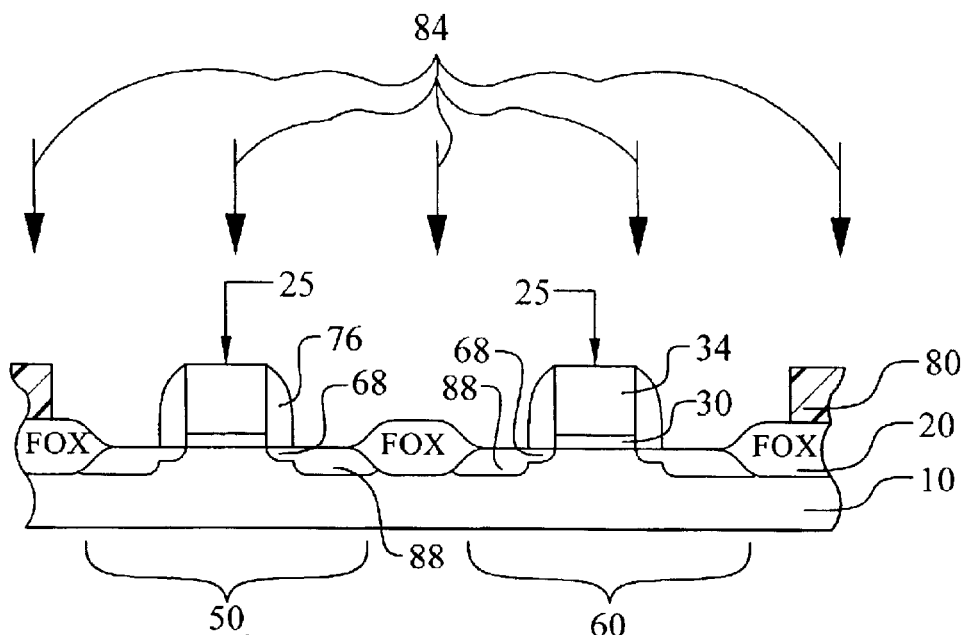
Figure 4:
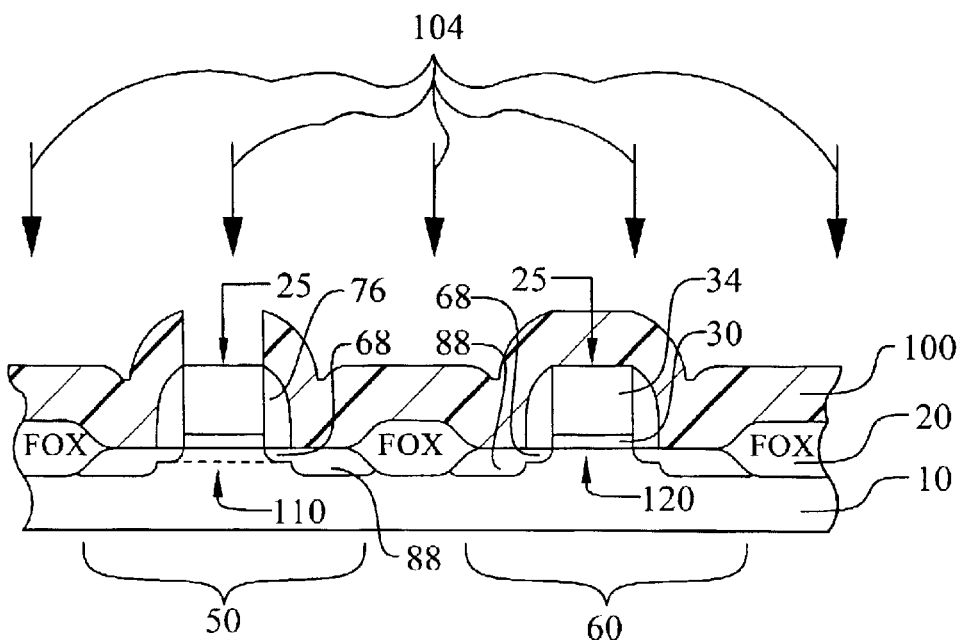
Figure 5:
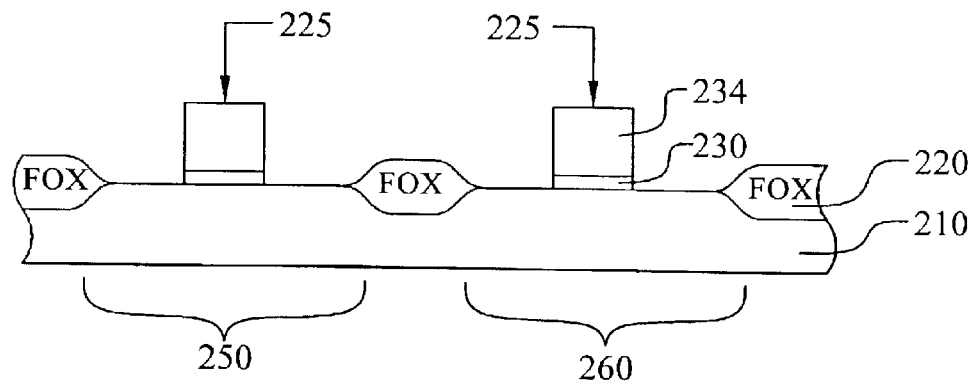
FIGS. 5 through 8 illustrate a preferred embodiment of the present invention showing a method to form and to code ROM devices.

Referring now to FIG. 5, the preferred embodiment of the present invention is illustrated. Several important features of the present invention are shown and discussed below. More particularly, a simplified cross-section of a ROM device is shown at an intermediate step in the fabrication process for a ROM array. The ROM array comprises a large number of ROM devices formed in a substrate 210. The substrate 210 comprises a semiconductor material and, more preferably, comprises monocrystalline silicon. This substrate 210 may further comprise a silicon-on-insulator structure as is well known in the art. In addition, the substrate 210 may comprise a well region or several well regions. In the cross-section show, two partially complete devices are shown. A first device 250 and a second device 260 are being formed in active areas in the substrate 210. The active areas are separated by field oxidation regions (FOX) 220. Alternatively, shallow trench isolation (STI) regions could serve as the isolation boundaries 220 between active areas 250 and 260.

Two MOS gates 225 have been formed in the active areas 250 and 260 by methods well known in the art. The MOS gates 225 comprise, for example, a conductive layer 234 overlying an insulating layer 230. More preferably, the conductive layer 234 comprises polysilicon and the insulating layer 230 comprises oxide. Other materials may be used for the conductive layer 234 and the insulating layer 230, as is well known in the art, without exceeding the scoped of the present invention.

The MOS gates 225 are formed by, for example, growing a thin layer of silicon dioxide on the substrate 210 to form the insulating layer 230. Polysilicon is then blanket deposited using, for example, low-pressure chemical vapor deposition (LPCVD) to form the conductive layer 234 overlying the insulating layer 230. The conductive layer 234 and the insulating layer 230 are then patterned using, for example, a photolithography and etching sequence. A photoresist layer, not shown, is coated overlying the conductive layer 234. The photoresist layer is exposed to actinic light through a mask and then developed. The developed photoresist pattern is then used to mask an etching process, such as a plasma dry etch, in which the exposed conductive layer 234 and insulating layer 230 are removed. After the photoresist layer is stripped, the remaining conductive layer 234 and insulating layer 230 stacks form MOS gates overlying the active regions 250 and 260. As discussed in the prior art, a Flash array, comprising floating gates and control gates, may be converted to a ROM array, as in a FlashROM device. To complete this conversion, several masking layers in the Flash gate structure are altered to simplify the Flash gate into a ROM gate comprising only a simple MOS gate as shown.

Figure 6:
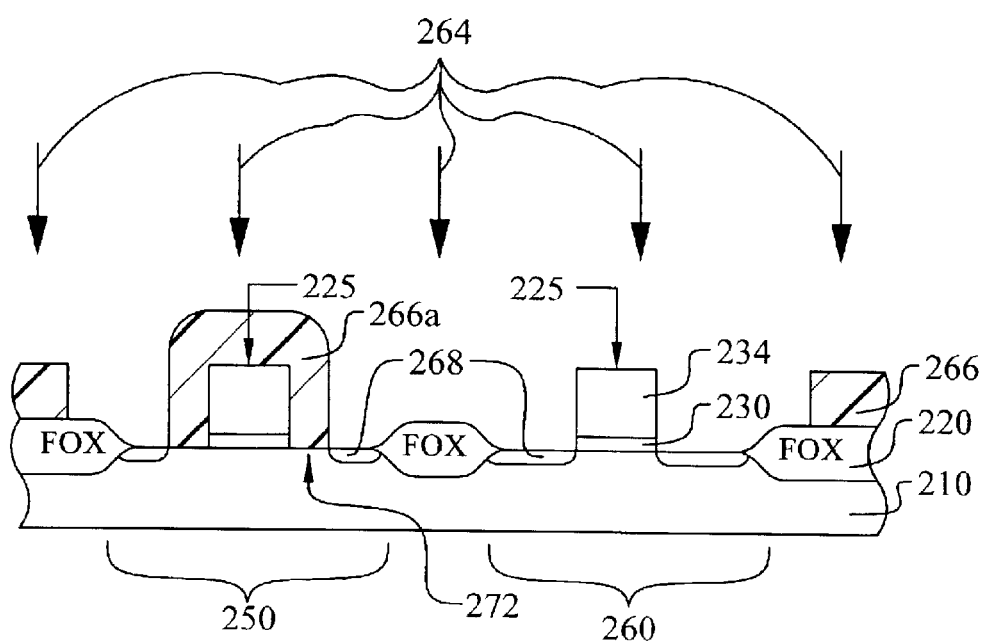

Referring now to FIG. 6, a particularly important feature of the present invention is illustrated. An ion implantation 264 is performed to form the LDD regions 268 for the ROM devices 250 and 260. As a particularly important feature, a novel LDD masking layer 266 and 266a is used to create a selective LDD implantation. Prior to the ion implantation step 264, a masking layer 266 is formed overlying the device. In the preferred case, this masking layer 266 and 266a comprises a photoresist material. However, other materials, such as antireflective coatings (ARC), may be used in the masking layer 266 and 266a. As an example, a photoresist layer 266 is coated overlying the device. The photoresist layer 266 is exposed to actinic light through the LDD layer mask. The photoresist layer is then developed to form the masking layer 266 and 266a shown. Note that the masking layer 266a covers the gate 225 for one of the ROM devices 250. Further, the masking layer 266a covers the sidewalls of the gate 225 such that an additional area 272 of the substrate 210 is covered on each side of the gate 225.

The LDD ion implantation 264 is then performed. Ions are implanted into the substrate 210 where it is not covered by the masking layer 266 and 266a, the gates 225, or the isolation regions 220. If the ROM array is an NMOS array, then the substrate 210 comprises a lightly-doped p-type material. In this case, the LDD implant 264 forms n-type regions 268 in the substrate. Alternatively, if the ROM array is a PMOS array, then the substrate comprises a lightly-doped n-type material and the LDD implant forms p-type regions 268 in the substrate. In addition, it is understood that a general threshold implantation may be performed to adjust the non-programmed threshold voltage level of the final ROM devices.

Of special importance to the present invention is the fact that the masking layer 266a causes the LDD regions 268 on the first device 250 to be offset 272 from the edges of the gate 225. By comparison, the LDD regions 268 for the second device 260 are self-aligned to the gate 225 edges. By offsetting the LDD regions on selected ROM transistors in this way, a novel method of creating constant-OFF devices is achieved.

In a typical, self-aligned LDD device 260, the LDD region 268 provides a same-type extension of the subsequently formed source/drain region. this LDD 'extension' connects the source and drain to the channel region that underlies the gate 225. In this way, the LDD allows the heavily-doped source/drain to be spaced a greater distance to improve short channel performance while still permitting the MOS transistor to form a continuous source-channel-drain path during inversion. However, the offset LDD regions 268 of the programmed device 250 do not reach to the MOS channel due to the offset 272. This will cause the completed ROM device 250 to have non-inverted substrate regions 272 between source and channel and between drain and channel. Therefore, the programmed ROM device 250 will be constant-OFF. Meanwhile, the non-programmed ROM device 260 can be turned ON. A method of programming the ROM array without adding a p-code implantation is therefore achieved.

Figure 7:
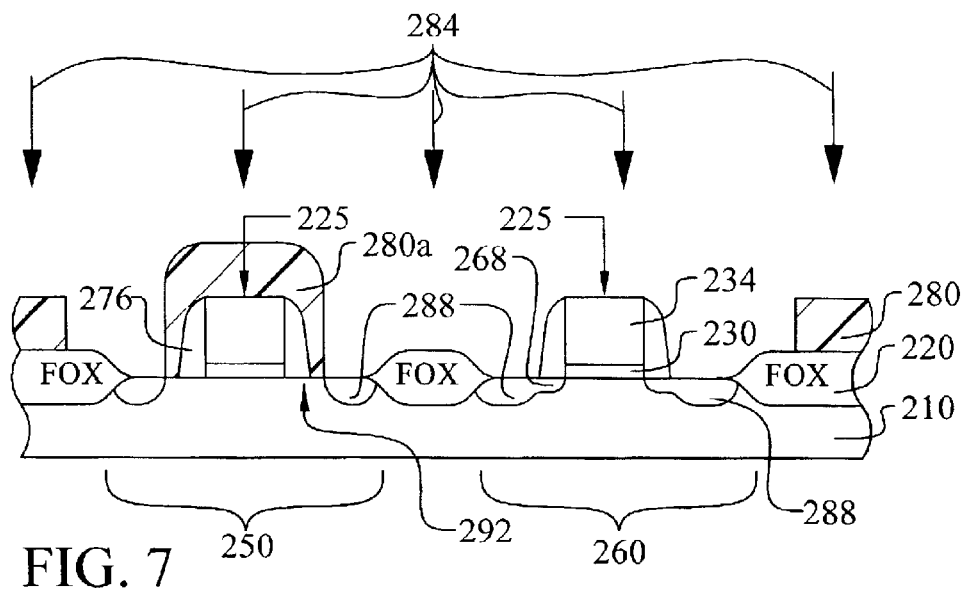

Referring now to FIG. 7, another important feature of the present invention is shown. While the offset LDD region 260 is theoretically sufficient to create constant-OFF devices in the ROM array, it is found that the source/drain implant step 284 may also be altered to improve the yield of the process. By additionally offsetting the source/drain regions 288 from the gates, the method insures that an always-OFF device is formed over the range of mask alignment tolerance. As in the prior art example, spacers 276 are formed on the sidewalls of the gates 225 prior to the source/drain implant 284. The spacers 276 comprise an insulator material. Preferably, the spacers 276 comprise oxide. The spacers 276 may be formed, as is well-known in the art, by first depositing a silicon oxide layer using, for example CVD. This oxide layer is then anisotropically etched to remove the oxide from lateral surfaces while leaving a substantial film on the sidewall of the vertical surfaces.

Following spacer 276 formation, ions are implanted 284 to form source/drain regions 288 for the ROM devices. As an important feature of the present invention, a second masking layer 280a is used to offset 292 the source/drain regions 288 of the programmed devices 250 from spacers 276. As in the above-described LDD implant, the second masking layer 280 and 280a preferably comprises a photoresist material. However, other materials, such as antireflective coatings (ARC), may be used in the masking layer 280 and 280a. As an example, a photoresist layer 280 is coated overlying the device. The photoresist layer 266 is exposed to actinic light through the source/drain layer mask. As an important alternative, the LDD layer mask may be used to expose the photoresist layer 280 for the source/drain masking layer 280 and 280a definition. In this case, it is only necessary to alter one masking layer—the LDD layer—to implement the ROM code onto the array. The photoresist layer 280 is then developed to form the masking layer 280 and 280a shown. Note that the masking layer 280a covers the gate 225 and spacers 276 for one of the ROM devices 250. Further, the masking layer 280a covers the spacers 276 of the gate 225 such that an additional area 292 of the substrate 210 is covered on each side of the spacers 276.

The source/drain ion implantation 284 is then performed. Ions are implanted into the substrate 210 where it is not covered by the masking layer 280 and 280a, the gates 225, or the isolation regions 220. If the ROM array is an NMOS array, then the source/drain implant 284 forms heavily n-type regions 288 in the substrate. Alternatively, if the ROM array is a PMOS array, then the source/drain implant forms p-type regions 288 in the substrate 210. As can clearly be seen, the offset of the source/drain regions 288 in the programmed device 250 will coincide with the offset of the LDD regions to cause the ROM device to be constant-OFF. By programming both the LDD and the source/drain regions in this way, a more robust process is realized to account for any misalignment source/drain masking step. Meanwhile, the non-programmed device 260 retains a normal device threshold.

Figure 8:
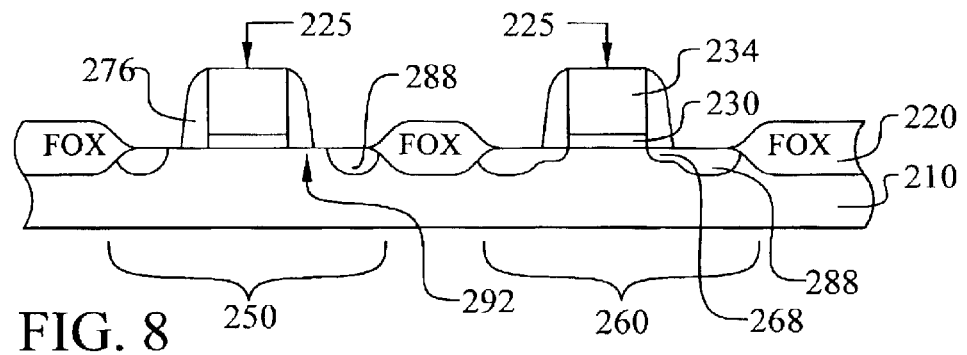

Referring now to FIG. 8, the resulting ROM array devices 250 and 260 are shown. The first device 250 can easily be read as a constant-OFF device by the ROM reading circuit. The second device 260 exhibits a normal threshold and can, therefore, be turned ON by the reading circuit.

Figure 9:
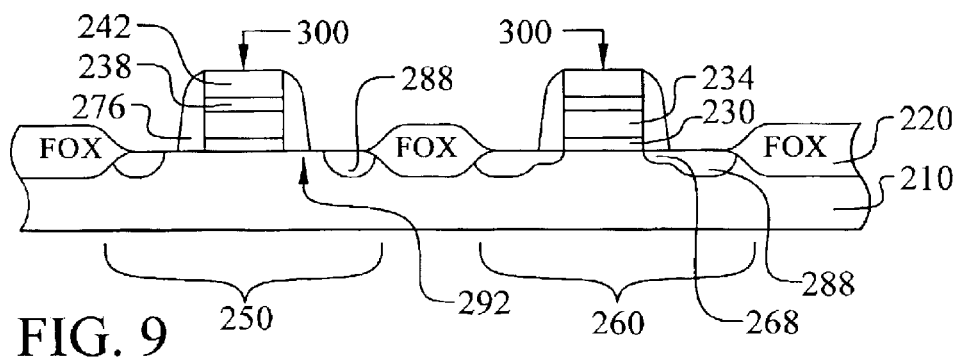
FIG. 9 illustrates an additional embodiment extending the present invention to the formation and coding of ROM devices having Flash stacked gates.

Referring now to FIG. 9, an alternative application of the present invention is illustrated. In particular, a Flash gate 300 is herein substituted for the MOS gate of the previous example. If a design required both Flash and ROM devices on the same integrated circuit device, it would be possible for the present method to be used to convert selected Flash devices into constant-OFF ROM devices. For example, a Flash gate 300 comprises a floating gate 234 and 230 and a control gate 242 and 238. The Flash gate 300 may comprise a simple stacked gate or a split gate structure. The method of forming a Flash gate 300 is well known in the art. For example, a first insulator layer 230 comprising oxide is grown overlying the substrate 210. A first conductive layer 234 preferably comprising polysilicon is the deposited overlying the first insulator layer 230. A second insulator layer 238, preferably comprising an oxide-nitride-oxide (ONO) film, is then deposited overlying the first conductive layer 234. A second conductive layer 242 is then deposited overlying the second insulator film 238. The stack of layers 230, 234, 238, and 242, is then patterned by methods well-known in the art to form the Flash gate stack 300 shown.

Unlike the first Flash-to-ROM method, that requires converting the Flash gates to ROM gate via several layer changes, this second method only requires changing a single layer—the LDD layer. Further, this method does not require the addition of a p-code implantation and mask. Finally, since the method does not rely on ion implantation into the channel region, further changes to the device layers are not required. The method thereby creates a significant cost and timing advantage over prior art attempts at FlashROM coding.

The advantages of the present invention may now be summarized. An effective and very manufacturable method to form and to code ROM devices is achieved. ROM devices can be formed and coded without adding a p-code, ion implantation step. Existing layers are used, and few layers are changed. Further, ROM devices can easily be formed and coded in a Flash device layout. These FlashROM devices can be formed and coded without adding an ion implantation step and by changing few masking levels.

As shown in the preferred embodiments, the novel method of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to form ROM devices in the manufacture of an integrated circuit device comprising:

providing a semiconductor substrate;

forming MOS gates overlying said substrate wherein said MOS gates comprise Flash gates each comprising a floating gate and a control gate;

implanting ions into said substrate to form lightly doped drains for said MOS gates wherein a masking layer is used to offset said lightly doped drains from selected said MOS gates to thereby form constant-OFF MOS gates;

thereafter forming spacers on sidewalls of said MOS gates; and thereafter implanting ions into said substrate to form source and drain regions for said MOS gates to thereby complete said ROM devices in the manufacture of said integrated circuit device wherein a second masking layer is used to offset said sources and drains from selective said spacers on said constant-OFF MOS gates and wherein said second masking layer is patterned using the same mask as used for said masking layer.

2. The method according to claim 1 wherein said ROM devices comprise NMOS transistors.

3. The method according to claim 1 wherein said ROM devices comprise PMOS transistors.

4. The method according to claim 1 wherein said masking layer comprises photoresist.

5. The method according to claim 1 wherein said spacers comprise oxide.

6. A method to form ROM devices in the manufacture of an integrated circuit device comprising:

providing a semiconductor substrate;

forming MOS gates overlying said substrate wherein said MOS gates comprise Flash gates each comprising a floating gate and a control gate;

implanting ions into said substrate to form lightly doped drains for said MOS gates wherein a first masking layer is used to offset said lightly doped drains from selected said MOS gates to thereby form constant-OFF MOS gates;

thereafter forming spacers on sidewalls of said MOS gates; and thereafter implanting ions into said substrate to form source and drain regions for said MOS gates to thereby complete said ROM devices in the manufacture of said integrated circuit device wherein a second masking layer is used to offset said sources and drains from said spacers of said constant-OFF MOS gates and wherein said first and second masking layers are patterned using the same mask.

7. The method according to claim 6 wherein said ROM devices comprise NMOS transistors.

8. The method according to claim 6 wherein said ROM devices comprise PMOS transistors.

9. The method according to claim 6 wherein said first and second masking layers comprises photoresist.

10. The method according to claim 6 wherein said spacers comprise oxide.

* * * * *